(12) United States Patent
Chen et al.

(10) Patent No.: US 6,286,178 B1
(45) Date of Patent: Sep. 11, 2001

(54) JET CLEANING DEVICE FOR DEVELOPING STATION

(75) Inventors: Tien-Ya Chen, Chupei; Chui-Kun Ke, Taichung, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/561,336

(22) Filed: Apr. 28, 2000

(30) Foreign Application Priority Data

Mar. 10, 2000 (TW) .................................................. 89203856

(51) Int. Cl.⁷ ....................................................... B08B 3/02
(52) U.S. Cl. ............................................. 15/303; 15/316.1
(58) Field of Search ................................... 15/302, 316.1, 15/310, 303

(56) References Cited

U.S. PATENT DOCUMENTS

| | | | |
|---|---|---|---|
| 4,541,141 | * 9/1985 | Le Goff | 15/302 |
| 5,361,449 | * 11/1994 | Akimoto | 15/302 |
| 5,375,291 | * 12/1994 | Tateyama et al. | 15/302 |
| 5,421,065 | * 6/1995 | Tateyama et al. | 15/302 |
| 5,608,943 | * 3/1997 | Konishi et al. | 15/302 |
| 5,706,843 | * 1/1998 | Matsuo | 15/302 X |

\* cited by examiner

*Primary Examiner*—Chris K. Moore
(74) *Attorney, Agent, or Firm*—Jiawei Huang; J.C. Patents

(57) ABSTRACT

A jet-cleaning device for a developing station is described, which jet-cleaning device is capable of removing chemical solution from the back surface of a silicon wafer without the need to perform time-consuming adjustment of knife ring position. The jet-cleaning device has a spin suction pad and a knife ring. The spin suction pad is used to support a silicon wafer. Inside the suction pad is a groove capable of delivering a jet of air onto the exposed wafer back surface so that dripping chemical solution can be blown away. The knife ring is erected under the wafer around the suction pad so that the sputtering of chemical solution back into the suction pad area is prevented.

5 Claims, 1 Drawing Sheet

JET CLEANING DEVICE FOR DEVELOPING STATION

CROSS-REFERENCE TO RELATED APPLICATION

This application claims the priority benefit of Taiwan application Ser. No. 89203856, filed Mar. 10, 2000.

BACKGROUND OF THE INVENTION

1. Field of the Invention

The present invention relates to a developing station. More particularly, the present invention relates to a developing station whose suction pad has a groove capable of blowing out a jet of gas to remove residual developer solution from the back surface of a wafer.

2. Description of the Related Art

The fabrication of integrated circuit (IC) involves a large number of steps and complicated operations. In general, a wafer has to go through hundreds of different processing steps and requires one to two months of processing time before each integrated circuit chip is ready for shipment. Principally, the IC industry is a high-tech industry that entails IC design, wafer fabrication, wafer testing and wafer packaging.

Among various IC fabrication steps, photolithography is a dominant process in semiconductor manufacturing. A large number of steps that relate to the fabrication of MOS transistors or structures such as film patterning and doping require performance of photolithographic operations. Typically, a photolithographic operation can be further subdivided into coating, exposure and development.

Using photolithographic development as an example, the process involves removing the exposed photoresist from a wafer by chemical means so that a photoresist pattern is formed. There are a number of methods of photoresist development. However, to be in line with conventional photolithographic operation, most commercial developing station employs what is known as the 'spray/puddle' method. The spray/puddle method can be roughly divided into three stages. In the first stage, developer solution is sprayed onto a wafer mounted on a spinner. In the second stage, the wafer remains is a static state for what is known as the puddle development. After development, the wafer is cleaned with water and then dried by spinning.

The aforementioned three-stage process can be entirely completed in the same developing station. FIG. 1 is a schematic cross-sectional view showing a jet-cleaning device within a conventional developing station. As shown in FIG. 1, the developing station includes a spin suction pad 10, a knife ring 12 and an external ring guard 14.

The spin suction pad 10 is used for supporting the back surface 18 of a wafer 16 so that developer solution can act on the positive wafer surface 20. The spin suction pad 10 has an external diameter smaller than the wafer 16 so that the peripheral portion of wafer back surface 18 is exposed. Since capillary action may result in the flow of developer liquid onto the wafer back surface 18 when the positive surface 20 of the wafer 16 is being developed, the wafer back surface 18 may be contaminated.

To prevent the inversion of liquid and contamination of wafer back surface 18, a plurality of hoses for emitting water jets 22 are normally installed under the spin suction pad 10. The water jets 22 aim at the back surface 18 so that any developer liquid flowing onto the back surface 18 may be removed. In order to stop the back flow of the water jets from mixing with the developer liquid, the suction pad 10 is surrounded by the knife ring 12. An external guard ring is also installed to prevent the sputtering of liquid outside the developing station.

However, since the water jets that target the wafer back surface do not form a continuous film of water, cleaning efficiency is rather low. Furthermore, to obtain the optimal cleaning, distance between the knife ring 12 and the wafer back surface 18 must be carefully set. Ideally, the water jets must flow to the edge of the wafer but permit no back flow of the developer liquid. Such an adjustment can be very time-consuming.

SUMMARY OF THE INVENTION

The invention provides a jet-cleaning device for a developing station. The jet-cleaning device comprises of a spin suction pad and knife ring. The spin suction pad is used for supporting a silicon wafer. The spin suction pad has an external diameter smaller than the external diameter of the wafer so that a portion of the wafer back surface is suspended in mid-air when the wafer is mounted on the pad. Inside the suction pad is a groove capable of delivering an air jet onto the exposed wafer back surface so that developer liquid can be blown away. The knife ring is erected under the wafer around the suction pad so that the sputtering of chemical solution back into the suction pad area is prevented.

Inert gases or nitrogen can be used to blow away the chemical solution such as developer liquid. In addition, an external ring guard can be installed around the wafer and the knife ring so that chemical solution will not sputter outside the developing station.

By directing the air jet from the spin suction pad towards the wafer back surface, the back flow of chemical liquid onto wafer back surface is prevented. Hence, there is not need to carry out time-consuming adjustment of knife ring position.

Accordingly, the present invention is to provide a jet-cleaning device for a developing station capable of clearing chemical liquid off the back surface of a wafer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
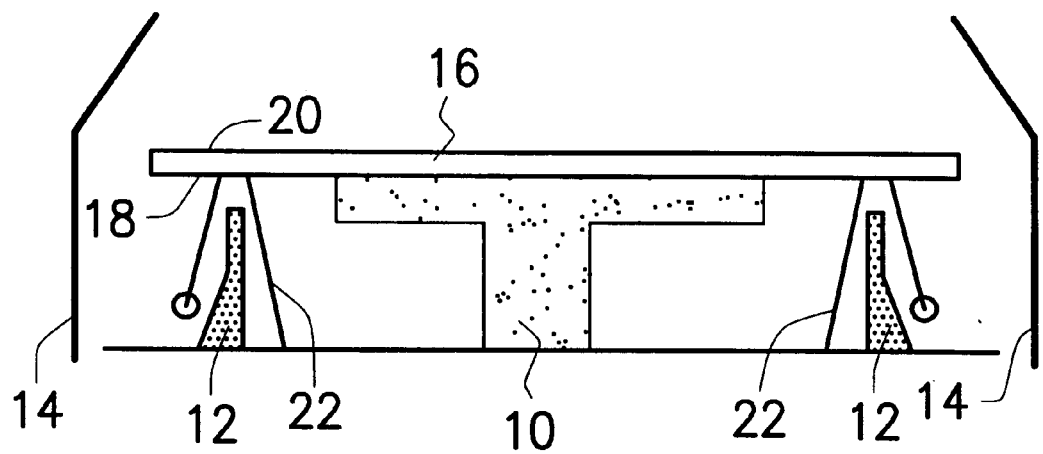
FIG. 1 is a schematic cross-sectional view showing a jet-cleaning device within a conventional developing station.

Reference will now be made in detail to the present preferred embodiments of the invention, examples of which are illustrated in the accompanying drawings. Wherever possible, the same reference numbers are used in the drawings and the description to refer to the same or like parts.

Figure 2:
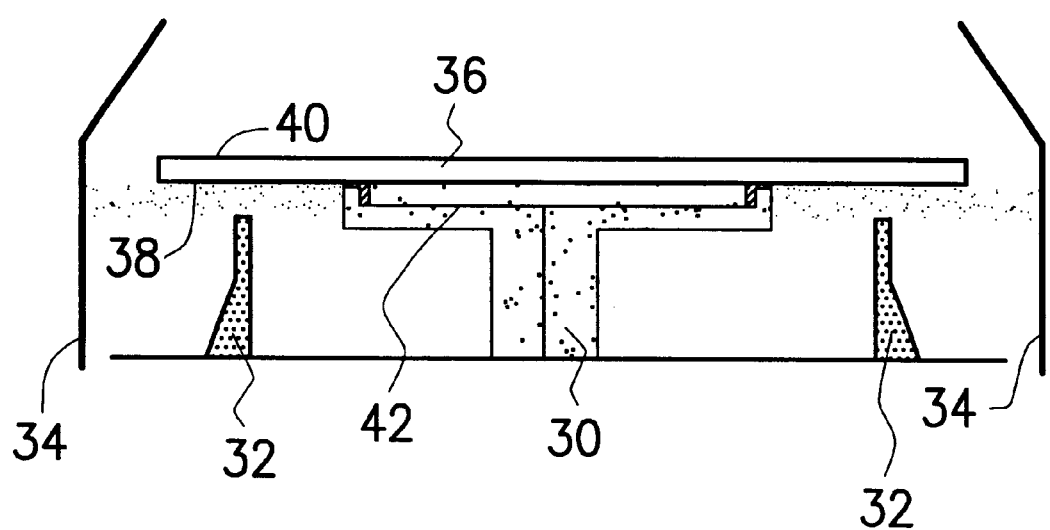
FIG. 2 is a schematic cross-sectional view showing a jet-cleaning device according to the invention within a developing station.

FIG. 2 is a schematic cross-sectional view showing a jet-cleaning device according to the invention within a developing station. As shown in FIG. 2, the jet-cleaning device comprises a spin suction pad 30, a knife ring 32 and an external ring guard 34.

The spin suction pad 30 is used to support the back surface 38 of a wafer 36 so that developer solution can act on positive wafer surface 40. The spin suction pad 30 has an external diameter smaller than the wafer 36 so that the peripheral portion of wafer back surface 38 is exposed.

Since a groove 42 is formed inside the spin suction pad 30, a jet of inert gas or nitrogen can be delivered to the peripheral section of the suction pad 30. The air jet is targeted at the back surface 38 of the wafer 36 so that any chemical liquid (developer solution) that tends to flow onto the wafer back surface 38 is blown back. Because the jet coming from the groove 42 is able to stop the back flow of developer liquid from moving under the back surface 38, careful adjustment of the knife ring 32 is unnecessary. Hence, a lot of adjustment time can be saved.

The knife ring 32 is erected under the wafer around the suction pad 30 so that the sputtering of chemical solution back into the suction pad area is prevented. In addition, an external ring guard 34 is installed around the wafer 36 and the knife ring 32 so that chemical solution will not sputter outside the developing station.

In summary, an additional groove is designed inside the spin suction pad of the jet-cleaning device. Consequently, any back-flowing developer liquid can be blown away by an air jet that targets the back surface of a wafer. Thus, the cleaning device not only can prevent the back flow of contaminated developer onto the wafer back surface, but also can avoid the time-consuming adjustment of the knife ring.

It will be apparent to those skilled in the art that various modifications and variations can be made to the structure of the present invention without departing from the scope or spirit of the invention. In view of the foregoing, it is intended that the present invention cover modifications and variations of the invention provided they fall within the scope of the following claims and their equivalents.

What is claimed is:

1. A jet-cleaning device for a developing station, suitable for removing a chemical solution from a back surface of a wafer, comprising:

a spin suction pad for supporting a silicon wafer, wherein the spin suction pad has an external diameter smaller than the silicon wafer so that a peripheral portion of the wafer back surface is exposed, and the spin suction pad also has an interior groove capable of directing a jet of air at an exposed back surface of the wafer so that any chemical solution on the wafer back surface is blown away; and a knife ring under the wafer around the spin suction pad for preventing the sputtering of chemical solution back into the spin suction pad.

2. The jet-cleaning device of claim 1, wherein the jet of air delivered from the groove includes an inert gas.

3. The jet-cleaning device of claim 2, wherein the jet of inert gas includes nitrogen.

4. The jet-cleaning device of claim 1, wherein the chemical solution includes a developer liquid.

5. The jet-cleaning device of claim 1, wherein the device further includes an external ring guard around the wafer and the knife ring, which external ring guard prevents the sputtering of chemical solution outside the developing station.

* * * * *